United States Patent
Zhao et al.

(10) Patent No.: US 10,266,760 B2
(45) Date of Patent: Apr. 23, 2019

(54) COMPOSITION OF, AND METHOD FOR FORMING, A SEMICONDUCTOR STRUCTURE WITH MULTIPLE INSULATOR COATINGS

(71) Applicant: Pacific Light Technologies Corp., Portland, OR (US)

(72) Inventors: Weiwen Zhao, Happy Valley, OR (US); Juanita N. Kurtin, Hillsboro, OR (US)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/391,685

(22) Filed: Dec. 27, 2016

(65) Prior Publication Data
US 2017/0110625 A1   Apr. 20, 2017

Related U.S. Application Data

(63) Continuation-in-part of application No. 15/154,766, filed on May 13, 2016, now Pat. No. 9,567,514.
(Continued)

(51) Int. Cl.
*H01L 29/02*  (2006.01)
*C09K 11/02*  (2006.01)
(Continued)

(52) U.S. Cl.
CPC .......... *C09K 11/025* (2013.01); *B82B 3/0019* (2013.01); *C09K 11/08* (2013.01);
(Continued)

(58) Field of Classification Search
None
See application file for complete search history.

(56) References Cited

U.S. PATENT DOCUMENTS

| 7,933,022 B2 | 4/2011 | Smith et al. |
| 9,267,889 B1 * | 2/2016 | Klopfer ................ G01N 21/648 |
| | | (Continued) |

FOREIGN PATENT DOCUMENTS

| EP | 2472612 A1 | 7/2012 |
| JP | 5035472 B | 9/2012 |
| | (Continued) | |

OTHER PUBLICATIONS

Gerion, D. et al., "Synthesis and properties of biocompatible water-soluble silica-coated CdSe/ZnS semiconductor quantum dots.", The Journal of Physical Chemistry B., (20010000), vol. 105, pp. 8861-8871, XP002262702.

(Continued)

*Primary Examiner* — Angel Roman
(74) *Attorney, Agent, or Firm* — Elliott, Ostrander & Preston, P.C.

(57) ABSTRACT

A semiconductor structure includes a nanocrystalline core comprising a first semiconductor material, and at least one nanocrystalline shell comprising a second, different, semiconductor material that at least partially surrounds the nanocrystalline core. The nanocrystalline core and the nanocrystalline shell(s) form a quantum dot. An insulator layer encapsulates the quantum dot to create a coated quantum dot, and at least one additional insulator layer encapsulates the coated quantum dot.

28 Claims, 11 Drawing Sheets

Related U.S. Application Data

(60) Provisional application No. 62/161,178, filed on May 13, 2015.

(51) Int. Cl.
*H01L 33/50* (2010.01)
*B82B 3/00* (2006.01)
*C09K 11/08* (2006.01)

(52) U.S. Cl.
CPC .... *H01L 33/502* (2013.01); *H01L 2933/0025* (2013.01); *H01L 2933/0041* (2013.01); *Y10S 438/962* (2013.01); *Y10S 977/774* (2013.01); *Y10S 977/952* (2013.01)

(56) References Cited

U.S. PATENT DOCUMENTS

| | | |
|---|---|---|
| 2007/0237460 A1 | 10/2007 | Fan et al. |
| 2007/0242713 A1 | 10/2007 | Spariosu et al. |
| 2008/0038558 A1 | 2/2008 | Landry et al. |
| 2008/0237540 A1 | 10/2008 | Dubrow |
| 2008/0252209 A1* | 10/2008 | Jang ............ C30B 7/14 313/506 |
| 2010/0053930 A1 | 3/2010 | Kim et al. |
| 2010/0086872 A1 | 4/2010 | Ogihara et al. |
| 2010/0123155 A1 | 5/2010 | Pickett et al. |
| 2010/0255311 A1 | 10/2010 | Lee et al. |
| 2011/0012087 A1 | 1/2011 | Allen et al. |
| 2011/0068321 A1 | 3/2011 | Pickett et al. |
| 2011/0176291 A1 | 7/2011 | Sanders et al. |
| 2012/0211774 A1 | 8/2012 | Harada |
| 2013/0112940 A1 | 5/2013 | Kurtin et al. |
| 2013/0112941 A1 | 5/2013 | Kurtin et al. |
| 2013/0112942 A1 | 5/2013 | Kurtin et al. |
| 2014/0009902 A1 | 1/2014 | Banin et al. |
| 2014/0049155 A1 | 2/2014 | Kurtin |
| 2014/0166973 A1 | 6/2014 | Kurtin et al. |
| 2014/0264073 A1* | 9/2014 | McLaughlin ...... G01N 21/6489 250/453.11 |
| 2014/0264257 A1* | 9/2014 | Hughes ............... C09K 11/02 257/13 |
| 2015/0008393 A1 | 1/2015 | Mangum et al. |
| 2015/0011029 A1 | 1/2015 | Mangum et al. |
| 2015/0240153 A1 | 8/2015 | Hughes et al. |
| 2016/0137916 A1 | 5/2016 | Wachi |
| 2016/0268483 A1 | 9/2016 | Theobald et al. |
| 2018/0166596 A1* | 6/2018 | Boulais ............ H01L 31/03521 |

FOREIGN PATENT DOCUMENTS

| | | |
|---|---|---|
| WO | 2012059931 A1 | 5/2012 |
| WO | 2017004145 A1 | 1/2017 |

OTHER PUBLICATIONS

Hu, X. et al., "Silica-polymer dual layer-encapsulated quantum dots with remarkable stability.", ACS Nano., (20100000), vol. 4, No. 10, pp. 6080-6086.

Pastoriza-Santos, I. et al., "One-pot synthesis of Ag@ TiO2 core-shell nanoparticles and their layer-by-layer assembly.", Langmuir., (20000000), vol. 16, No. 6, pp. 2731-2735.

Qian, L. et al., "Stable and efficient quantum-dot light-emitting diodes based on solution-processed multilayer structures.", Nature Photonics., (20110000), vol. 5, No. 9, pp. 543-548.

Brinker, et al. "Sol Gel Glass: I. Gelation and Gell Structure," Journal of Non-Crystalline Solids 70, 1985, pp. 301-322.

Fan, X., et al., "Coupling semiconductor nanocrystals to a fused-silica microsphere: a quantum-dot microcavity with extremely high Q factors," Optics Letters, vol. 25, No. 21, Nov. 1, 2000, pp. 1600-1602.

International Preliminary Report on Patentability for International Patent Application No. PCT/US2014/044663, dated Jan. 5, 2016, 8 pages.

International Search Report and Written Opinion for International Patent Application No. PCT/US2014/044663, dated Oct. 16, 2014, 11 pages.

Non-Final Office Action for U.S. Appl. No. 13/972,700, dated Aug. 28, 2015, 18 pages.

Non-Final Office Action for U.S. Appl. No. 14/104,489, dated Feb. 20, 2015, 12 pages.

Notice of Allowance for U.S. Appl. No. 14/104,489, dated Sep. 21, 2015.

Rosa-Fox, et al., "Organic-Inorganic Hybrid Materials from Sonogels," Apr. 26, 2002, 92 pgs.

\* cited by examiner

COMPOSITION OF, AND METHOD FOR FORMING, A SEMICONDUCTOR STRUCTURE WITH MULTIPLE INSULATOR COATINGS

CROSS-REFERENCE TO RELATED APPLICATIONS

This application is a continuation-in-part, and claims the benefit of, U.S. non-provisional patent application Ser. No. 15/154,766, filed May 13, 2016, which claims priority to U.S. provisional application No. 62/161,178, filed May 13, 2015, the entire contents of which are hereby incorporated by reference herein.

BACKGROUND

What is needed is a chemical composition of quantum dots, and method of forming the same, that protects the quantum dots, for example, from water vapor and oxygen, in order to extend the lifetime of quantum dot-based lighting and display devices, as well as other devices that include quantum dots.

SUMMARY

A semiconductor structure is fabricated by first forming a nanocrystalline core from a first semiconductor material, then forming a nanocrystalline shell from a second, different, semiconductor material that at least partially surrounds the nanocrystalline core. The nanocrystalline core and the nanocrystalline shell form a quantum dot. Multiple insulating layers are then formed, encapsulating the quantum dot.

DETAILED DESCRIPTION

A semiconductor structure is fabricated by first forming a nanocrystalline core from a first semiconductor material, then forming a nanocrystalline shell from a, different, semiconductor material that at least partially surrounds the nanocrystalline core. Additional nanocrystalline shells may also be formed that surround the core/shell pairing. The nanocrystalline core and the nanocrystalline shell(s) form a quantum dot. Multiple insulating layers are then formed, encapsulating the quantum dot in an insulating structure. In an embodiment, the insulating layers comprise inorganic material. By applying multiple insulating layers to individually encapsulated quantum dots, defects which might span the thickness of the individual insulating layers are interrupted and do not channel continuously through the insulating structure comprising all the multiple insulating layers. The multiple insulating layer embodiment creates a tortuous path resulting in very long effective diffusion pathways for environmental degradants, thereby increasing the lifetime of the quantum dot, as well as any device that includes the quantum dot.

Semiconductor structures having a thick insulating structure comprised of a plurality of insulating layers (a "thick insulator coating") and methods of fabricating semiconductor structures having a thick insulator coating are described. In an example, a method of coating a semiconductor structure with multiple layers of silica is described, including optional acid or base treatments between layers.

It has been found that quantum dots treated with multiple rounds of insulator coating, with base treatment in between the rounds in one embodiment, exhibit improved thermal stability, high temperature reliability, and/or high humidity reliability, all of which are typically desired for good performance in a light-emitting-diode (LED) package.

Quantum dots are materials which are beneficial in many applications, but which often cannot withstand thousands of hours of operation under the environmental and operating conditions of many products, for example, light emitting diode (LED) or solar devices. According to embodiments of the invention, quantum dots are made robust for certain applications by individually coating the surfaces of the quantum dots with layers of metal oxide (for example silica, titania, alumina, etc.). An example of quantum dots with a single insulator layer is described below with reference to FIG. 4. However, the single layer may not be sufficient to protect the quantum dots in all operating or environmental conditions, due to the imperfect or porous coverage of the metal oxide. Adding additional layers of metal oxide or other insulating material makes the quantum dots more robust by further protecting the surfaces and filling in any imperfections or pores.

Figure 1:
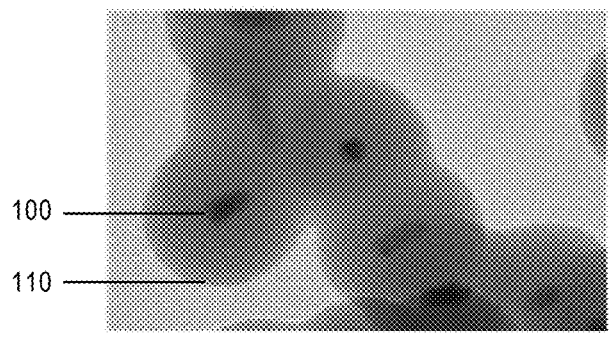
FIG. 1 is an image from a Transmission Electron Microscope (TEM) of a quantum dot coated with an insulator layer prior to further coating the quantum dot with another insulator layer according to an embodiment of the invention.

Additionally, in order to ensure that there is no self-quenching of photoluminescence or other interactions between or among quantum dots, in one embodiment, the first metal oxide insulator layer serves as an adjustable spacer that allows the quantum dots to remain fully dispersed and spaced apart prior to adding a second metal oxide coating. By adding the first metal oxide layer, for example, using a sol-gel process, whether by a reverse micelle, or similar, sol-gel process, the individual quantum dots 100 are coated with enough material 110 to ensure adequate monodispersity, as seen in the Transmission Electron Microscope (TEM) image in FIG. 1, and avoid self-quenching.

Finally, metal oxide coating of quantum dots prior to adding further insulator coatings renders the quantum dots more thermally stable so they can sustain a higher processing temperature than uncoated quantum dots.

Figure 2A:
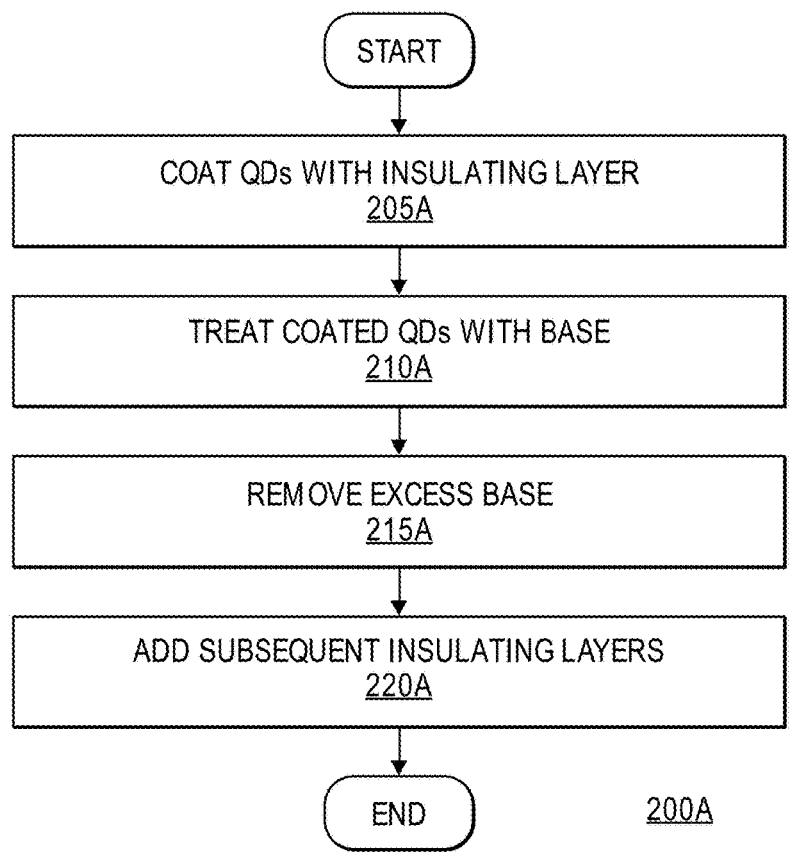
FIGS. 2A, 2B, 2C, 2D, 2E and 2F are a flow diagrams in accordance with various embodiments of the invention.
Figure 7:
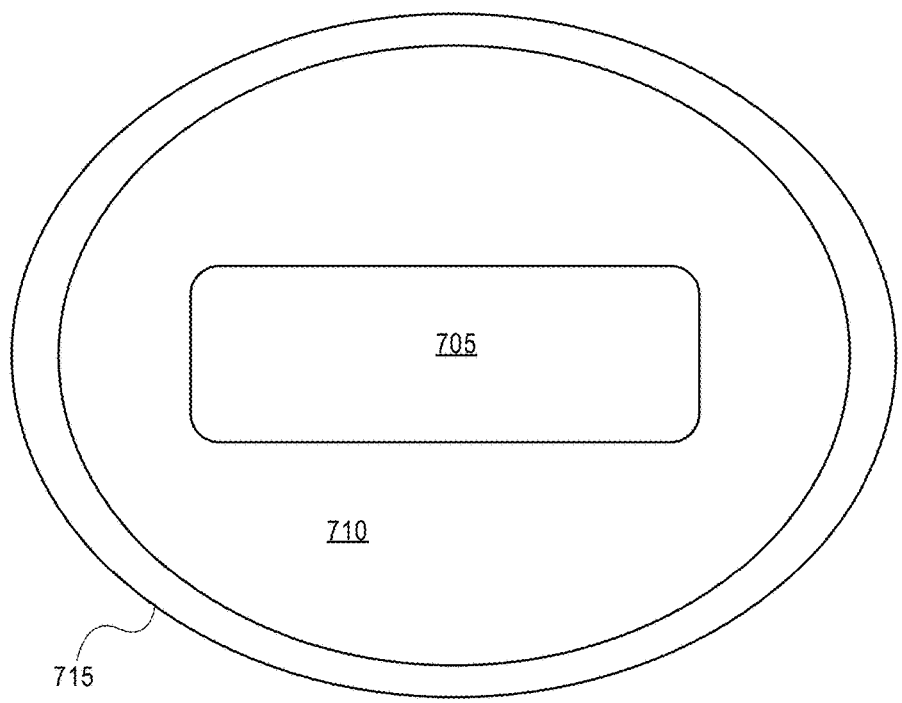
FIG. 7 illustrates a coated quantum dot fabricated according to an embodiment of the invention.

In one embodiment of the invention 200A, with reference to the flow diagram in FIG. 2A, and the structure 700 illustrated in FIG. 7, the fabrication of quantum dots, comprising core 705 and shell 710, with multiple insulator coatings 715 for use in, as an example, on-chip light emitting diode applications, is described. A number of quantum dots are subjected to multiple rounds of silica coating or other insulator material, for example, by sol-gel process, combined with base treatment after each round of coating. Quantum dots are coated with a first insulating layer 715 at 205A. This first insulating layer may be added via a reverse micelle method, a direct micelle method, or some other sol-gel process. These coated quantum dots are then treated at 210A with base (caustic), followed at 215A by removing excess or un-reacted base to ensure that a correct amount of base, which acts as a catalyst, is used for adding another insulating layer. Finally, one or more insulating layers 715 are added at 220A, with a base treatment after each round of coating. There are several methods from which to select to add each subsequent layer, according to embodiments of the invention, including (1) reverse micelle, e.g., using Igepal to form the reverse micelle, (2) direct micelle, e.g., using AOT, (3) the Stober sol-gel process, (4) and an acid-catalyzed sol-gel process by acidifying an aqueous solution of metal silicate, or any other gel forming methods known to those skilled in the art.

For example, a first layer of silica may be formed around individual quantum dots using a sol-gel process, such as a reverse micelle sol-gel reaction. After purification, the silica coated quantum dots are treated with base or a mixture of different bases either by adding base(s) directly to a concentrated quantum dot stock solution in solvent or to a diluted solution of quantum dots. After base treatment, excess or un-reacted base is removed by one or more rounds of wash with an appropriate solvent, such as methanol and ethanol. More silica layers can then be grown on the base-treated silica coated quantum dots. The subsequent silica coating additions can be accomplished in several ways: (1) by a reverse micelle sol-gel process as described in U.S. patent application Ser. No. 13/485,756; (2) by a direct micelle sol-gel process as described in US patent application Ser. No. 13/972,700, or (3) by a Stober sol-gel process.

Figure 2B:
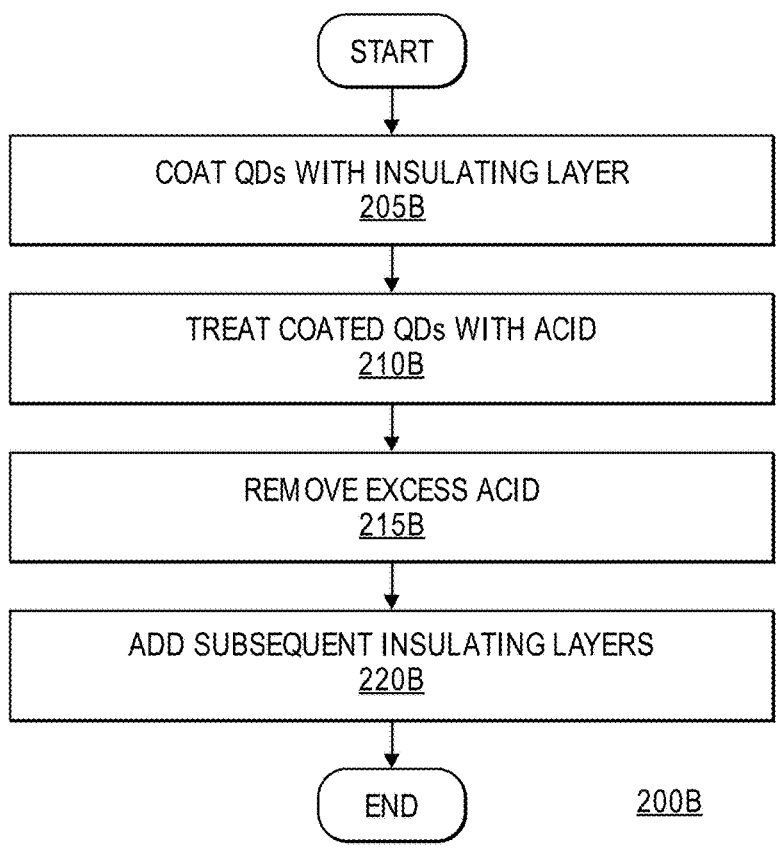

In another embodiment 200B, with reference to the flow diagram in FIG. 2B, and the structure 700 illustrated in FIG. 7, involving the fabrication of quantum dots with multiple insulating coatings for on-chip light emitting diode applications, a plurality of quantum dots is subjected to multiple rounds of sol-gel processing combined with acid treatment, as opposed to base treatment, after each round of processing.

In this embodiment, a first layer of silica is formed around the quantum dots at 205B, using a sol-gel process, for example, using a reverse micelle sol-gel reaction. After purification, the silica shelled quantum dots are then treated with an acid or a mixture of different acids either by adding acid(s) directly to a concentrated quantum dot stock solution in solvent or to a diluted solution of quantum dots, at 210B. After acid treatment, excess or un-reacted acid is removed at 215B with one or more rounds of wash with an appropriate solvent, such as methanol and ethanol, ensuring that a correct amount of catalyst base is used for the application of additional layers. Next, at 220B, one or more silica layers can be grown on the acid treated silica layered quantum dots. The silica layer addition can be accomplished in several ways: (1) by a reverse micelle sol-gel process; (2) by a direct micelle sol-gel; (3) by a Stober sol-gel process, or (4) by a sol-gel process that acidifies the aqueous solution of metal silicate.

Figure 2C:
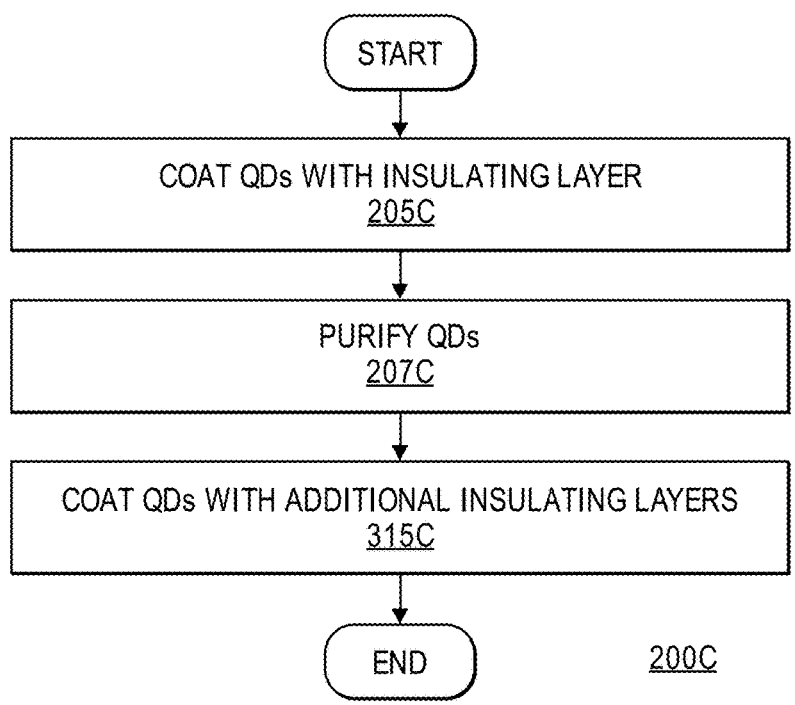

In yet another embodiment 200C, with reference to the flow diagram in FIG. 2C, and the structure 700 illustrated in FIG. 7, involving the fabrication of quantum dots with multiple insulator coatings for on-chip light emitting diode applications, a plurality of quantum dots is subjected to multiple rounds of insulator coating by sol-gel processes combined with no chemical treatment after each round of coating.

In this embodiment, a first layer of silica is formed around the quantum dots at 205C, for example, using a sol-gel process, such as a reverse micelle sol-gel reaction. The silica coated quantum dots are then purified at 207C. After purification, the silica coated quantum dots are subjected at 315C to another round or more of silica coating by any of the following ways: (1) by a reverse micelle sol-gel; (2) by a direct micelle sol-gel process; (3) by a Stober sol-gel process, or (4) by a sol-gel process that acidifies the aqueous solution of metal silicate.

Figure 2D:
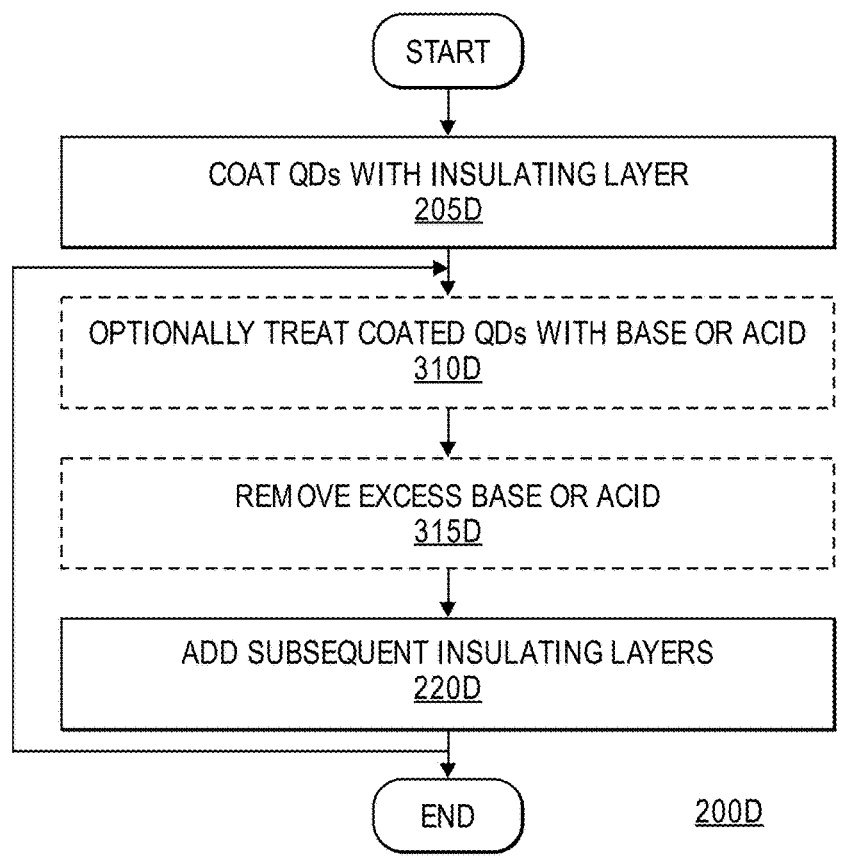

In yet another embodiment 200D, with references to the flow diagram in FIG. 2D, and the structure 700 illustrated in FIG. 7, involving the fabrication of quantum dots with multiple insulating coatings for on-chip light emitting diode applications, a plurality of quantum dots is subjected to multiple rounds of silica coating by sol-gel processes, where certain layers are treated by caustics after the addition of the layer is complete, and others are not.

In this embodiment, a layer of silica is formed at 205D around each of the quantum dots using a sol-gel process, such as a reverse micelle sol-gel reaction. At this point the layer can then be treated with base, or acid, or may receive no treatment, at 310D. If the first insulating layer is treated with base or acid, the process continues at 315D with removal of any excess base or acid. Otherwise, or next, as the case may be, at 220D, the silica coated quantum dots are subjected to another one or more rounds of silica coating by any of the following ways: (1) by a reverse micelle sol-gel process; (2) by a direct micelle sol-gel process; (3) by a Stober sol-gel process, or (4) by a sol-gel process that acidifies the aqueous solution of metal silicate. The additional layers of silica coating can be treated again with base or acid or may receive no treatment and additional layers of silica coating can be added using any of the above methods.

Other possible ways to add the insulating layer are as follows (using silica as an example but not limited to silica): 1) during the silica coating process, a silica gel forming precursor can be injected at once; 2) during the silica coating process, a silica gel forming precursor can be injected at multiple times; or 3) during the silica coating process, a silica gel forming precursor can be injected using a syringe pump at desired rate. FIG. 2 is an image from a TEM of coated quantum dots resulting from using a syringe pump.

Figure 3:
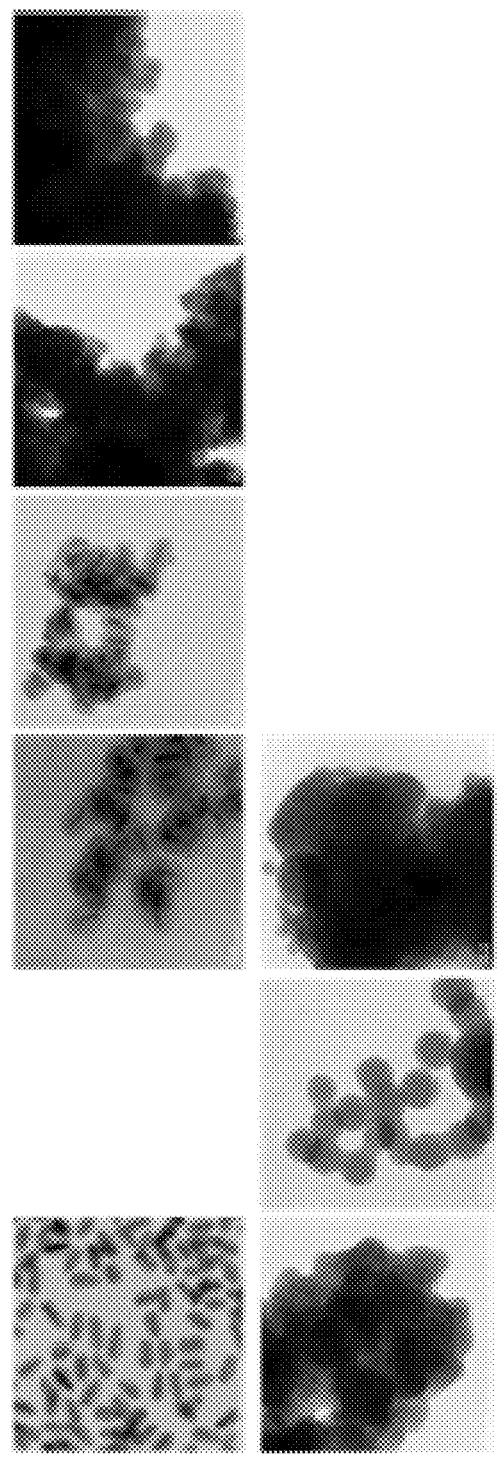
FIG. 3 provides TEM images 300 of quantum dot particles coated with metal oxide layers of varying thickness.

In another embodiment, multiple insulating layers are applied, in which the multiple layers ("multilayers") consist of alternating organic and inorganic layers that encapsulate the metal-oxide coated quantum dots. Examples of multilayer encapsulation include alternating layers of inorganic materials such as $Al_2O_3$, MgO, and $SiO_x$, and $SiN_x$ as well as transition metals including copper, cobalt, and iron deposited by ALD. Parylene is an exemplary organic layer in multilayer structures and may serve as the final layer due to its low modulus and hydrophobic nature. Also, a final layer of Parylene keeps water from condensing on the $Al_2O_3$ layer, which is known to corrode $Al_2O_3$. Being a relatively flexible polymer, Parylene may also help with stress relaxation during the addition of the multiple inorganic layers. Parylene can be introduced by vapor-phase deposition between or after the addition of the inorganic layers. The Parylene deposition can be done at room temperature, eliminating any risk of thermal damage to the samples. FIG. 3 provides TEM images 300 of quantum dot particles coated with metal oxide layers of varying thickness. Parylene is the trade name for a variety of chemical vapor deposited poly(p-xylylene) polymers.

In one embodiment, water-absorbing polymers can be used as organic layers to protect quantum dots from humid environments. Water absorbing polymers include but are not limited to poly(vinyl alcohol) PVA, poly(ethylene oxide)

PEO, polyacrylamide, polyacrylate, poly(acrylic acid) and partially neutralised, lightly cross-linked poly(acrylic acid). There are a number of ways to attach these water-absorbing polymers to silica coated quantum dots. For example, a hydroxyl group (OH group) on the outer surface of a silica shell insulator layer surface can be first reacted with cyanuric chloride, a multifunctional crosslinker. Then PVA can be attached to the silica shell outer surface by reacting with cyanuric chloride. In another example, the silica shell is first modified with aminosilanes to provide amino functional groups on the outer surface. Using a classical carbodiimide coupling chemistry, poly(acrylic acid) can be attached to the silica shell outer surface.

Multiple water absorbing polymer layers can be built using a straightforward, elegant, layer-by-layer (LBL) method. According to one embodiment, the LBL assembly includes immersing a charged substrate, for instance, quantum dots negatively charged with poly(acrylic acid), in a solution of positively charged polyelectrolyte such as poly (diallyldimethylammonium) (PDDA). After rinsing with water, PDDA forms a positively charged monolayer on the surface of the substrate. Immersion in a solution of negatively charged polyelectrolyte forms a new layer, thereby switching the surface charge. This cycle can be repeated as many times as desired to assemble layers of water absorbing polymers on the quantum dots.

The above embodiments describe, with reference to FIGS. 2A-2D and the structure 700 illustrated in FIG. 7, the fabrication of quantum dots, comprising core 705 and shell 710, with multiple insulator coatings 715 for use in, as an example, on-chip light emitting diode applications. A number of quantum dots are subjected to multiple rounds of silica coating or other insulator material, for example, by sol-gel process, optionally combined with acid or base treatment after each round of coating. Quantum dots are coated with a first insulating layer 715 at 205A/205B/205C and 205D. The above embodiments describe this first insulating layer may be added via a reverse micelle method, a direct micelle method, or some other sol-gel process. According to another embodiment 200E, the method combines quantum dots, surfactants, an aminosilane, and a silica precursor in order to grow the first silica shell insulating layer. The chemicals are similar as described in the above embodiments, but micelles are not being formed, so the embodiment does not involve a reverse micelle process.

Figure 2E:
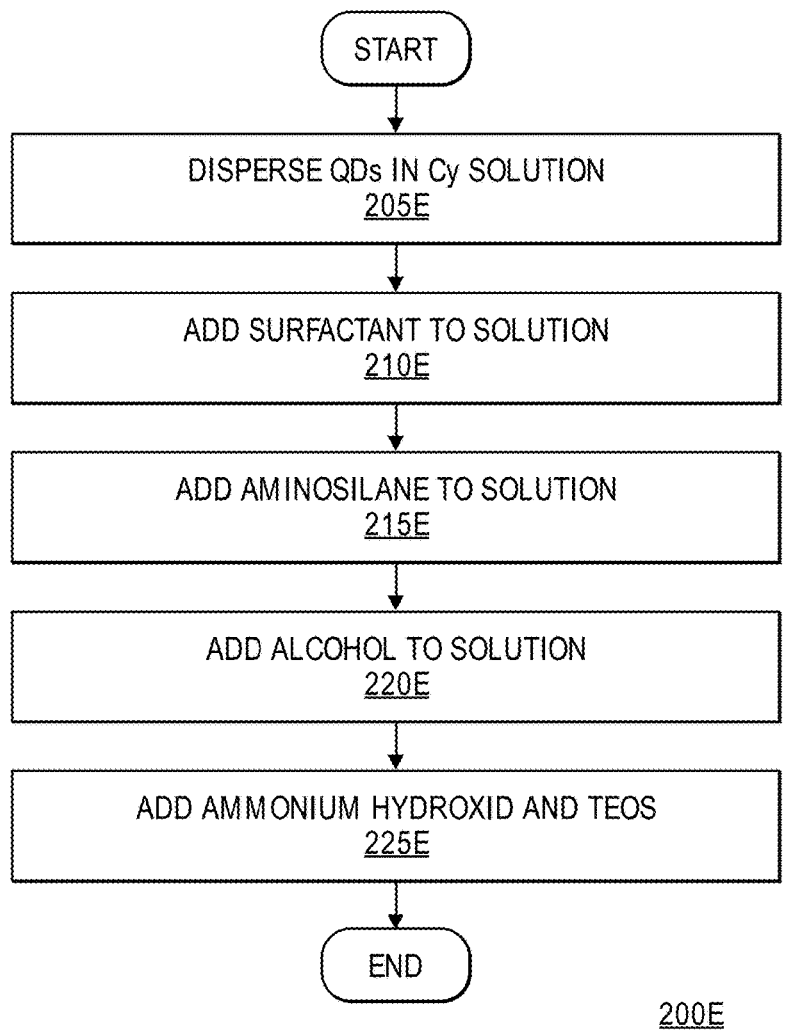

In embodiment 200E, with reference to FIG. 2E, quantum dots are dispersed in cyclohexane (Cy) liquid at 205E to create a solution. A surfactant, such as polyoxyethylene (5) nonylphenylether, is added to the solution at 210E. Then an aminosilane is added to the quantum dot solution at 215E.

After few minutes of mixing, an alcohol (MeOH, EtOH, IPA etc) is added at 220E. The role of the surfactant used here is to help disperse quantum dots having non-polar hydrophobic ligands on the surface in a polar solvent like alcohol. At this point, the quantum dot solution is optically clear. Subsequently, ammonium hydroxide and tetraorthosilicate (TEOS) are added to the quantum dot solution at 225E to start the reaction to coat the quantum dots with silica shell.

Compared to the reverse micelle sol-gel process used in the embodiments described with reference to FIGS. 2A-2D, this embodiment is more effective in growing large silica particles with diameters of hundreds of nanometers to a few microns. Unlike the micelle method, there is no size limiting micelle formed in this embodiment. Therefore the silica particles can grow much larger.

Figure 2F:
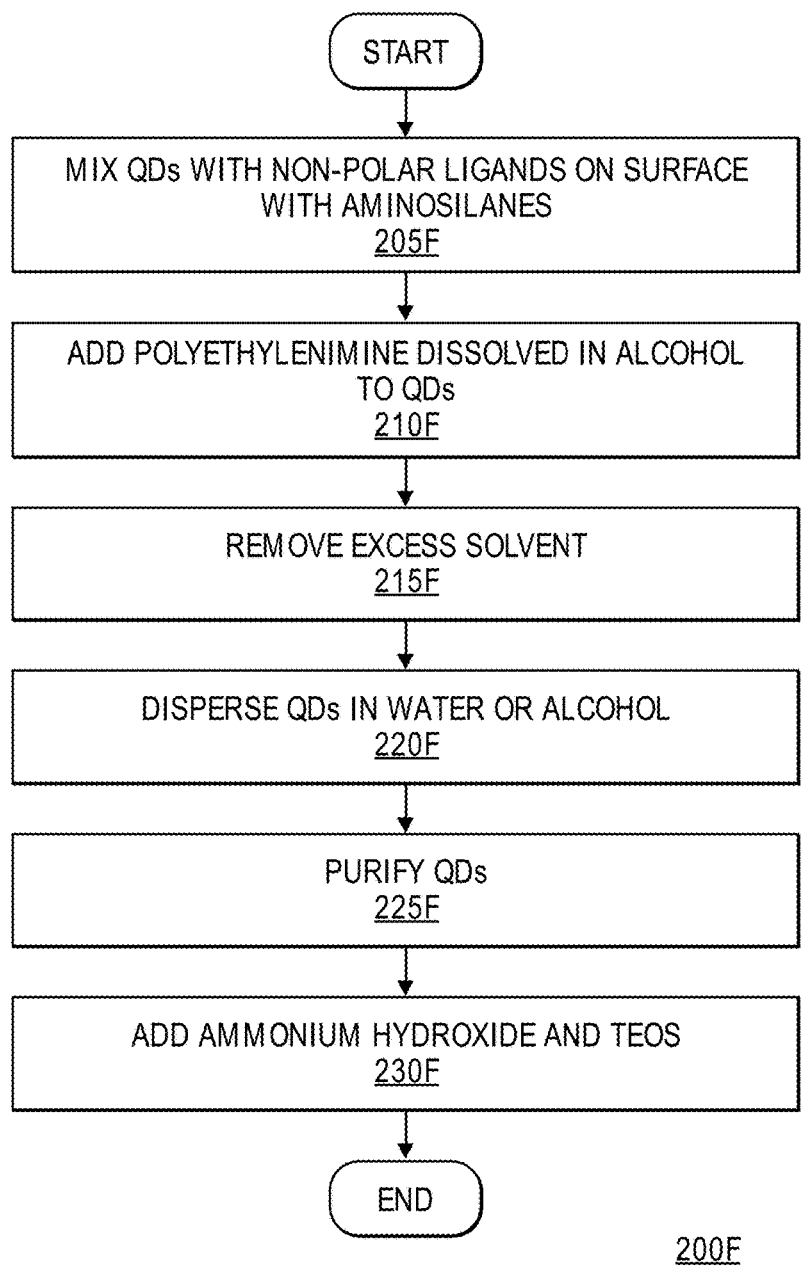

In yet another embodiment, 200F, with reference to FIG. 2F, quantum dots with non-polar organic ligands on the surface are exchanged with polar ligands such as polyallylamine and polyethylenimine in order to grow the first silica shell insulating layer. These amine polymers have multiple binding groups to allow them to hold onto the quantum dots much tighter than the mono dentate ligands widely used in the quantum dot synthesis. Also, the amine polymers are soluble in both alcohol and water, allowing the silica shell growth around the quantum dots by the Stober sol-gel process to grow large particles effectively.

In embodiment 200F, quantum dots with non-polar organic ligands on the surface are mixed with aminosilanes with stirring at 205F. Polyethylenimine dissolved in alcohol is then added to the quantum dots and stirred overnight at room or elevated temperature at 210F. In another embodiment, polyallylamine is used instead of polyethylenimine. In another embodiment, no aminosilane is added to the quantum dots at 205F. Instead, the quantum dots are mixed directly with polyallyamine or polyethylemine at 210F. After ligand exchange, excess solvents can be removed using a rotary evaporator at 215F. To the remaining quantum dots, water or alcohol is added to disperse the quantum dots at 220F. Next, the quantum dots are purified using an ultrafiltration filter to remove excess polymer at 225F. Finally, silica shell insulating layers can be grown around the polyamine coated quantum dots at 230F using Stober sol-gel method, by simply mixing quantum dots with tetraorthosilicate (TEOS) or any suitable precursor and ammonium hydroxide in alcohol/water mixture.

Example of Quantum Dots with an Insulator Layer

As explained above, embodiments of the invention involve forming multiple insulator coatings on quantum dots, including optional base or acid treatments in between coatings. The following is an example of quantum dots that may be treated and/or coated with insulator layers according to the above-described methods. Although the following examples may occasionally refer to a first or single insulator coating, the description may apply to any of the multiple insulator coatings. Additionally, the above-described methods may apply to any type of quantum dots, and are not limited to the below-described coated quantum dots. In a general embodiment, a semiconductor structure includes a nanocrystalline core composed of a first semiconductor material. The semiconductor structure also includes a nanocrystalline shell composed of a second, different, semiconductor material at least partially surrounding the nanocrystalline core. Additional nanocrystalline shells may also be formed that surround the core/shell pairing. An insulator layer encapsulates, e.g., coats, the nanocrystalline shell and nanocrystalline core. Thus, coated semiconductor structures include coated structures such as the quantum dots described above. For example, in an embodiment, the nanocrystalline core is anisotropic, e.g., having an aspect ratio between, but not including, 1.0 and 2.0. In another example, in an embodiment, the nanocrystalline core is anisotropic and is asymmetrically oriented within the nanocrystalline shell. In an embodiment, the nanocrystalline core and the nanocrystalline shell form a quantum dot. In another embodiment, one or more additional semiconductor layers may be surround the quantum dot. An insulator layer may be formed so that it encapsulates, e.g., coats, the final semiconductor layer. After forming the first insulator layer, the coated quantum dot may be coated with subsequent insulator layers. In between the formation of each insulator layer, the coated quantum dot may optionally be treated with an acid or base as described above.

With reference to the above described coated nanocrystalline core and nanocrystalline shell pairings, in an embodiment, the insulator layer is bonded directly to the nanocrystalline shell. In one such embodiment, the insulator layer passivates an outermost surface of the nanocrystalline shell. In another embodiment, the insulator layer provides a barrier for the nanocrystalline shell and nanocrystalline core impermeable to an environment outside of the insulator layer.

In any case, the insulator layer may encapsulate only a single nanocrystalline shell/nanocrystalline core pairing. In an embodiment, the semiconductor structure further includes a nanocrystalline outer shell at least partially surrounding the nanocrystalline shell, between the nanocrystalline shell and the insulator layer. The nanocrystalline outer shell is composed of a third semiconductor material different from the semiconductor material of the shell and, possibly, different from the semiconductor material of the core.

With reference again to the above described coated nanocrystalline core and nanocrystalline shell pairings, in an embodiment, the insulator layer is composed of a layer of material such as, but not limited to, silica (SiOx), titanium oxide (TiOx), zirconium oxide (ZrOx), alumina (AlOx), or hafnia (HfOx). In one such embodiment, the layer is silica having a thickness approximately in the range of 3-500 nanometers. In an embodiment, the insulator layer is an amorphous layer.

With reference again to the above described coated nanocrystalline core and nanocrystalline shell pairings, in an embodiment, an outer surface of the insulator layer is ligand-free. However, in an alternative embodiment, an outer surface of the insulator layer is ligand-functionalized. In one such embodiment, the outer surface of the insulator layer is ligand-functionalized with a ligand such as, but not limited to, a silane having one or more hydrolyzable groups or a functional or non-functional bipodal silane. In another such embodiment, the outer surface of the insulator layer is ligand functionalized with a ligand such as, but not limited to, mono-, di-, or tri-alkoxysilanes with three, two or one inert or organofunctional substituents of the general formula (R1O)3SiR2; (R1O)2SiR2R3; (R1O)SiR2R3R4, where R1 is methyl, ethyl, propyl, isopropyl, or butyl, R2, R3 and R4 are identical or different and are H substituents, alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a silane with the general structure (R1O)3Si—(CH2)n-R—(CH2)n-Si(RO)3 where R and R1 is H or an organic substituent selected from the group consisting of alkyls, alkenes, alkynes, aryls, halogeno-derivates, alcohols, (mono, di, tri, poly) ethyleneglycols, (secondary, tertiary, quaternary) amines, diamines, polyamines, azides, isocyanates, acrylates, metacrylates, epoxies, ethers, aldehydes, carboxylates, esters, anhydrides, phosphates, phosphines, mercaptos, thiols, sulfonates, and are linear or cyclic, a chlorosilane, or an azasilane.

In another such embodiment, the outer surface of the insulator layer is ligand-functionalized with a ligand such as, but not limited to, organic or inorganic compounds with functionality for bonding to a silica surface by chemical or non-chemical interactions such as but not limited to covalent, ionic, H-bonding, or Van der Waals forces. In yet another such embodiment, the outer surface of the insulator layer is ligand-functionalized with a ligand such as, but not limited to, the methoxy and ethoxy silanes (MeO)3SiAllyl, (MeO)3SiVinyl, (MeO)2SiMeVinyl, (EtO)3SiVinyl, EtOSi(Vinyl)3, mono-methoxy silanes, chloro-silanes, or 1,2-bis-(triethoxysilyl)ethane.

In any case, in an embodiment, the outer surface of the insulator layer is ligand-functionalized to impart solubility, dispersability, heat stability, photo-stability, or a combination thereof, to the semiconductor structure. For example, in one embodiment, the outer surface of the insulator layer includes OH groups suitable for reaction with an intermediate linker to link small molecules, oligomers, polymers or macromolecules to the outer surface of the insulator layer, the intermediate linker one such as, but not limited to, an epoxide, a carbonyldiimidazole, a cyanuric chloride, or an isocyanate.

With reference again to the above described coated nanocrystalline core and nanocrystalline shell pairings, in an embodiment, the nanocrystalline core has a diameter approximately in the range of 2-6 nanometers. The nanocrystalline shell has a long axis and a short axis, the long axis having a length approximately in the range of 6-40 nanometers, and the short axis having a length approximately in the range of 1-10 nanometers greater than the diameter of the nanocrystalline core. The insulator layer has a thickness approximately in the range of 1-50 nanometers along an axis co-axial with the long axis and has a thickness approximately in the range of 3-50 nanometers along an axis co-axial with the short axis. In other embodiments, the thickness of the insulator layer may be greater than 50 nanometers, for example, up to 500 nanometers.

A lighting apparatus may include a light emitting diode and a plurality of semiconductor structures that, for example, act to down convert light absorbed from the light emitting diode. For example, in one embodiment, each semiconductor structure includes a quantum dot having a nanocrystalline core composed of a first semiconductor material and a nanocrystalline shell composed of a second, different, semiconductor material at least partially surrounding the nanocrystalline core. Each quantum dot has a photoluminescence quantum yield (PLQY) of at least 90%. Each quantum dot may optionally have additional semiconductor layers.

As described briefly above, an insulator layer may be formed to encapsulate a nanocrystalline shell and anisotropic nanocrystalline core. For example, in an embodiment, a layer of silica is formed using a reverse micelle sol-gel reaction. In one such embodiment, using the reverse micelle sol-gel reaction includes dissolving the nanocrystalline shell/nanocrystalline core pairing in a first non-polar solvent to form a first solution. Subsequently, the first solution is added along with a species such as, but not limited to, 3-aminopropyltrimethoxysilane (APTMS), 3-mercapto-trimethoxysilane, or a silane comprising a phosphonic acid or carboxylic acid functional group, to a second solution having a surfactant dissolved in a second non-polar solvent. Subsequently, ammonium hydroxide and tetraorthosilicate (TEOS) are added to the second solution.

Figure 4:
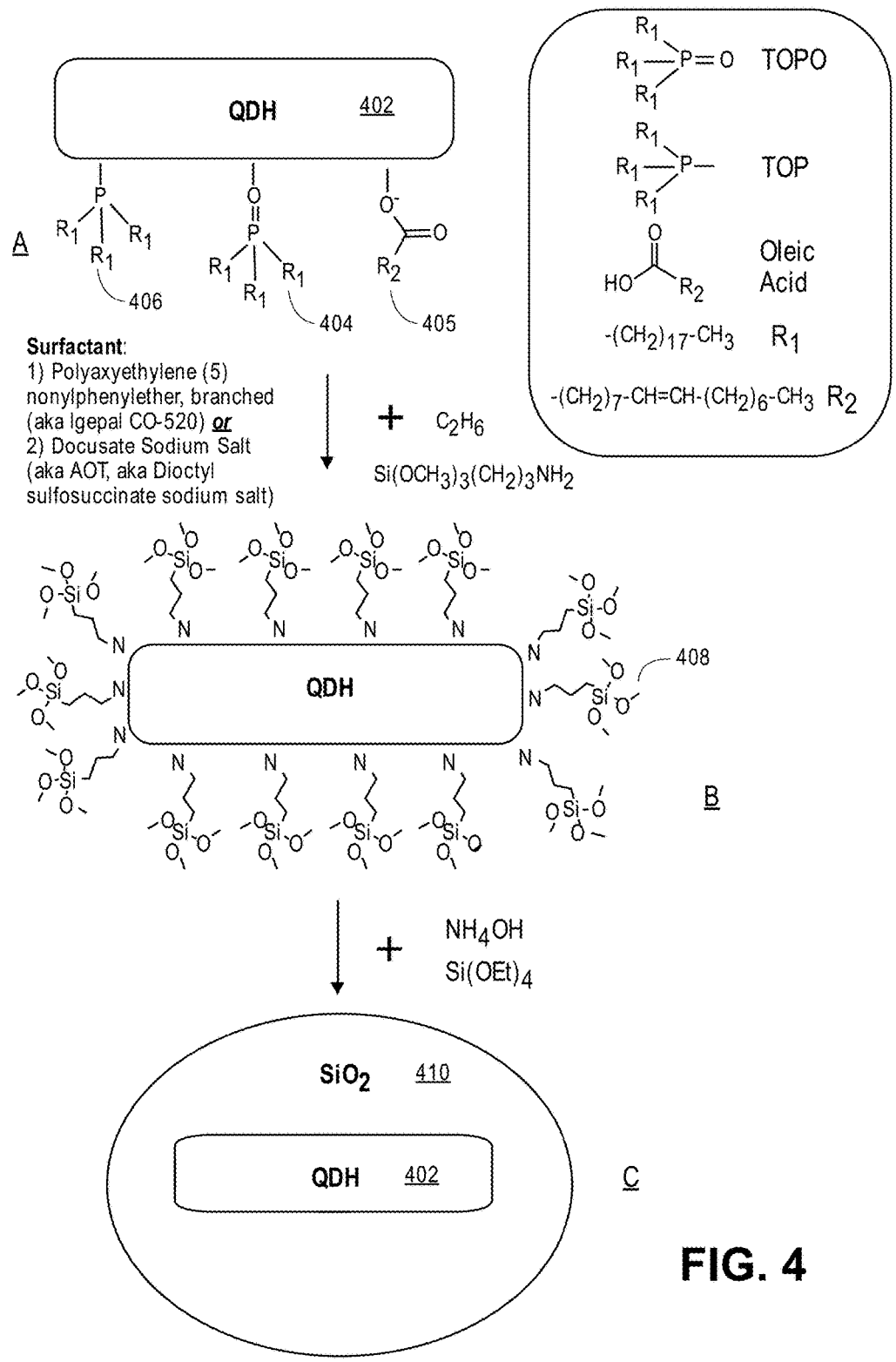
FIG. 4 provides an example of quantum dots with an insulator layer according to an embodiment of the invention.

Thus, semiconductor nanocrystals coated with silica according to the present invention may be made by a sol-gel reaction such as a reverse micelle method. As an example, FIG. 4 illustrates operations in a reverse micelle approach to coating a semiconductor structure, in accordance with an embodiment of the present invention. Referring to part A of FIG. 4, a quantum dot heterostructure (QDH) 502 (e.g., a nanocrystalline core/shell pairing) has attached thereto one or more of trioctylphosphine oxide (TOPO) ligands 404, trioctylphosphine (TOP) ligands 406, and Oleic Acid 405.

Referring to part B, the plurality of TOPO ligands 404, TOP ligands 406, and Oleic Acid 405, are exchanged with a plurality of Si(OCH3)3(CH2)3NH2 ligands 408. The structure of part B is then reacted with TEOS (Si(OEt)4) and ammonium hydroxide (NH4OH) to form a silica coating 410 surrounding the QDH 402, as depicted in part C of FIG. 4.

With reference again to the above-described method of forming coated nanocrystalline core and nanocrystalline shell pairings, i.e., coated semiconductor quantum dots, in an embodiment, the first and second non-polar solvents are cyclohexane. In an embodiment, forming the coating layer includes forming a layer of silica and further includes using a combination of dioctyl sodium sulfosuccinate (AOT) and tetraorthosilicate (TEOS). In another embodiment, however, forming the layer includes forming a layer of silica and further includes using a combination of polyoxyethylene (5) nonylphenylether and tetraorthosilicate (TEOS). In another embodiment, however, forming the layer includes forming a layer of silica and further includes using cationic surfactants such as CTAS (cetyltrimethylammonium bromide), anionic surfactants, non-ionic surfactants, or pluronic surfactants such as Pluronic F 127 (an ethylene oxide/propylene oxide block co-polymer) as well as mixtures of surfactants.

Upon initiation of growth of a silica coating, the final size of that coating may be directly related to the amount of TEOS in the reaction solution. Silica coatings according to embodiments of the present invention may be conformal to the core/shell QDH or non-conformal. A silica coating may be between about 3 nm and 500 nm nm thick. The silica coating thickness along the c-axis may be as small as about 1 nm or as large as about 500 nm. The silica coating thickness along the a-axis may be between about 3 nm and 500 nm. Once silica coating is complete, the product is washed with solvent to remove any remaining ligands. The silica-coated quantum dots can then be incorporated into a polymer matrix or undergo further surface functionalization. However, silica layers according to embodiments of the present invention may also be functionalized with ligands to impart solubility, dispersability, heat stability and photostability in the matrix.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications.

Figure 5:
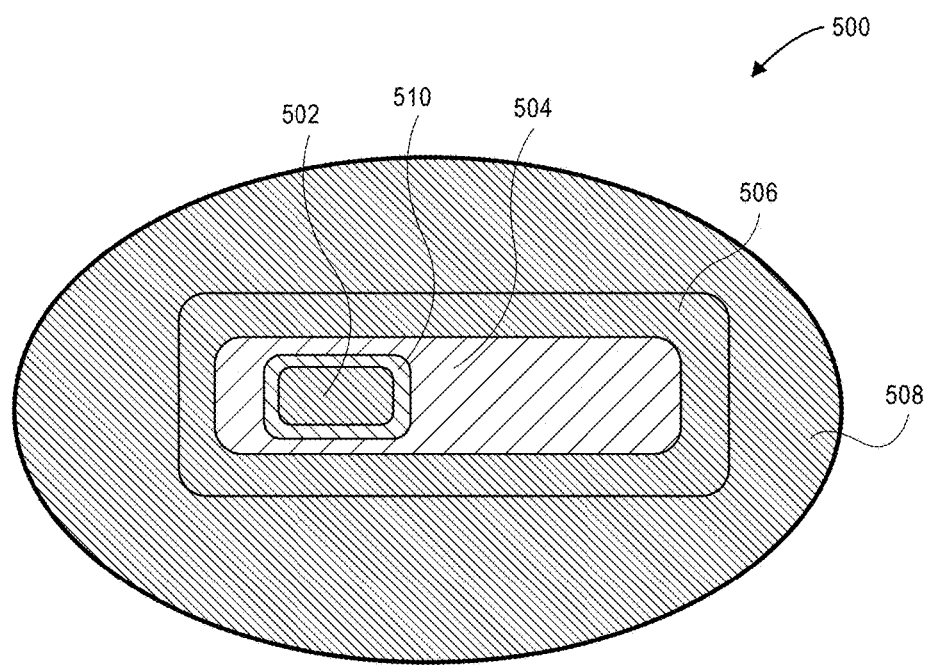
FIG. 5 is an illustration of a semiconductor structure that has a nanocrystalline core and nanocrystalline shell pairing with one compositional transition layer, in accordance with an embodiment of the invention.

In another example, and as illustrated in FIG. 5 below, a semiconductor structure has a nanocrystalline core and nanocrystalline shell pairing with one compositional transition layer, in accordance with an embodiment of the present invention.

Referring to FIG. 5, a semiconductor structure 500 includes a nanocrystalline core 502 composed of a first semiconductor material. A nanocrystalline shell 504 composed of a second, different, semiconductor material at least partially surrounds the nanocrystalline core 502. A compositional transition layer 510 is disposed between, and in contact with, the nanocrystalline core 502 and nanocrystalline shell 504. The compositional transition layer 510 has a composition intermediate to the first and second semiconductor materials.

In an embodiment, the compositional transition layer 510 is an alloyed layer composed of a mixture of the first and second semiconductor materials. In another embodiment, the compositional transition layer 510 is a graded layer composed of a compositional gradient of the first semiconductor material proximate to the nanocrystalline core 502 through to the second semiconductor material proximate to the nanocrystalline shell 504. In either case, in a specific embodiment, the compositional transition layer 510 has a thickness approximately in the range of 1.5-2 monolayers. Exemplary embodiments include a structure 500 where the first semiconductor material is cadmium selenide (CdSe), the second semiconductor material is cadmium sulfide (CdS), and the compositional transition layer 510 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 510 is composed of $Cd_xZn_ySe$, where $0<x<1$ and $0<y<1$.

In an embodiment, the nanocrystalline shell 504 completely surrounds the nanocrystalline core 502, as depicted in FIG. 5. In an alternative embodiment, however, the nanocrystalline shell 504 only partially surrounds the nanocrystalline core 502, exposing a portion of the nanocrystalline core 502. Furthermore, in either case, the nanocrystalline core 502 may be disposed in an asymmetric orientation with respect to the nanocrystalline shell 504. In one or more embodiments, semiconductor structures such as 500 are fabricated to further include a nanocrystalline outer shell 506 at least partially surrounding the nanocrystalline shell 504. The nanocrystalline outer shell 506 may be composed of a third semiconductor material different from the first and second semiconductor materials, i.e., different from the materials of the core 502 and shell 504. The nanocrystalline outer shell 506 may completely surround the nanocrystalline shell 504 or may only partially surround the nanocrystalline shell 504, exposing a portion of the nanocrystalline shell 504. Lastly, an insulator layer 508 encapsulates the shell 506. In one embodiment, multiple insulator layers may be applied, as described elsewhere herein.

In another embodiment, a network of quantum dots may be formed by fusing together the insulator coatings of a plurality of insulator coated quantum dots. For example, in accordance with an embodiment of the present invention, insulator coatings of discrete passivated quantum dots are fused together to form a substantially rigid network of quantum dots where each quantum dot is isolated from other quantum dots in the network by the fused insulator coating. In one such embodiment, fusing together the insulator coatings of discretely passivated quantum dots into a fused network provides improved optical and reliability performance of the resulting structure as compared with the starting discretely passivated quantum dots. In one such embodiment, a chemical base is used to improve the optical performance of silica coated materials by enabling the fusing of the insulator coatings surrounding a plurality of quantum dots. In a specific embodiment, the insulator coatings is a silica coating and a base such as potassium hydroxide (KOH) is used to fuse together the silica coatings of a plurality of individually and discretely coated quantum dots. The result is a substantially rigid silica-based network of quantum dots. The amount of base material is scaled with the amount of silica in the reaction. In general, the approaches described herein have important applications for improving the optical and reliability performance of quantum dots or even other phosphor materials having an insulator coating and which are embedded in a matrix. In one such embodiment, the quantum dots or other phosphor materials are first individually coated with one or more insulator layers and then the coated materials are fused to form an insulator network that can be embedded in a matrix. In other embodiments, the insulator network is formed directly on the quantum dots or other phosphor materials.

In an embodiment, then, with respect to using colloidal semiconductor nanocrystals, also known as quantum dots, as downshifting fluorescent materials for LED lighting and/or display technologies, quantum dots are individually coated with a silica insulator layer. The presence of the silica coating improves the performance of the quantum dots when they are subsequently embedded in a polymer film and subjected to various stress tests. Applications include LED lighting applications and/or display configurations. The use of base (such as KOH, NaOH or other similar materials) provides a fused network of the silica coated quantum dots to improve the optical performance of quantum dot materials. As described below, in particular embodiments, the scaling of the amount of KOH or other base with silica content is balanced to achieve optimal performance of the coated/fused quantum dots.

In an embodiment, a method of fabricating a semiconductor structure involves forming a mixture including a plurality of discrete semiconductor quantum dots. Each of the plurality of discrete semiconductor quantum dots is discretely coated by an insulator layer. The method also involves adding a base to the mixture to fuse the insulator layers of each of the plurality of discrete quantum dots, providing an insulator network. Each of the plurality of discrete semiconductor quantum dots is spaced apart from one another by the insulator network. The base may be comprised of, but not limited to, LiOH, RbOH, CsOH, MgOH, $Ca(OH)_2$, $Sr(OH)_2$, $Sa(OH)_2$, $(Me)4NOH$, $(Et)4NOH$, or $(Bu)4NOH$.

In another embodiment, a method of fabricating a semiconductor structure involves forming a mixture including a plurality of discrete semiconductor quantum dots. Each of the plurality of discrete semiconductor quantum dots is discretely coated by an insulator material. The method also involves adding a base to the mixture to fuse the insulator coating of each of the plurality of discrete quantum dots, providing an insulator network. Each of the plurality of discrete semiconductor quantum dots is spaced apart from one another by the insulator network. The base may be comprised of, but not limited to, LiOH, RbOH, CsOH, MgOH, $(Me)4NOH$, $(Et)4NOH$, or $(Su)4NOH$, and adding the base to the mixture involves adding one mole of the base for every two moles of the insulator material. The method also involves adding free silica to the mixture.

In another embodiment, a method of fabricating a semiconductor structure involves forming a mixture including a plurality of discrete semiconductor quantum dots. Each of the plurality of discrete semiconductor quantum dots is discretely coated by an insulator material. The method also involves adding a base to the mixture to fuse the insulator coating of each of the plurality of discrete quantum dots, providing an insulator network. Each of the plurality of discrete semiconductor quantum dots is spaced apart from one another by the insulator network. The base may be comprised of, but not limited to, $Ca(OH)_2$, $Sr(OH)_2$ or $Sa(OH)_2$, and adding the base to the mixture involves adding one mole of the base for every four moles of the insulator material. The method also involves adding free silica to the mixture.

In accordance with one or more embodiments herein, an alternative to altering seed size for tuning the emission of a seeded rod emitter architecture is provided. More particularly, instead of changing seed size, the seed composition is changed by alloying either the entire seed (in one embodiment) or some portion of the seed (in another embodiment) with a higher bandgap material. In either case, the general approach can be referred to as an alloying of the seed or nanocrystalline core portion of a heterostructure quantum dot. By alloying the seed or nanocrystalline core, the bandgap can be changed without changing the size of the seed or core. As such, the emission of the seed or core can be changed without changing the size of the seed or core. In one such embodiment, the size of the seed is fixed at the optimum size of a red-emitting seed, or roughly 4 nanometers. The fixed sized means that the size of the rod and the subsequent synthetic operations may not need to be substantially re-optimized or altered as the emission target of the quantum dots is changed.

Accordingly, in one or more embodiments described herein, optimum physical dimensions of a seeded rod are maintained as constant while tuning the emission peak of the heterostructure quantum dot. This can be performed without changing the dimensions of the seed (and therefore the rod) for each emission color. In a particular embodiment, a quantum dot includes an alloyed Group II-VI nanocrystalline core. The quantum dot also includes a Group II-VI nanocrystalline shell composed of a semiconductor material composition different from the alloyed Group II-VI nanocrystalline core. The Group II-VI nanocrystalline shell is bonded to and completely surrounds the alloyed Group II-VI nanocrystalline core. In one such embodiment, the alloyed Group II-VI nanocrystalline core is composed of $CdSe_nS_{1-n}$ ($0<n<1$), and the Group II-VI nanocrystalline shell is composed of CdS. In a specific embodiment, the alloyed Group II-VI nanocrystalline core has a shortest diameter of greater than approximately 2 nanometers, and the quantum dot has an exciton peak less than 555 nanometers. In a particular embodiment, the alloyed Group II-VI nanocrystalline core has a shortest diameter of approximately 4 nanometers, and the quantum dot has an exciton peak less than 555 nanometers, as is described in greater detail below Perhaps more generally, in an embodiment, a quantum dot includes a semiconductor nanocrystalline core of arbitrary composition. The quantum dot also includes any number of semiconductor nanocrystalline shell(s). The semiconductor nanocrystalline shell(s) is/are bonded to and completely surrounds the semiconductor nanocrystalline core. In one such embodiment, the semiconductor nanocrystalline core is composed of a first Group II-VI material, and the binary semiconductor nanocrystalline shell is composed of a second, different, Group II-VI material. In one such embodiment, the first Group II-VI material is $CdSe_nS_{1-n}$ ($0<n<1$), and the second Group II-VI material is CdS.

One or more embodiments described herein involve fabrication of a semiconductor hetero-structure. The semiconductor hetero-structure has a nano-crystalline core composed of a group semiconductor material. A nano-crystalline shell composed of a second, different, semiconductor material at least partially surrounds the nano-crystalline core. For example, the nano-crystalline shell may be composed of a different group I-III-VI semiconductor material or of a group II-VI semiconductor material.

In one such embodiment, the above described nano-crystalline core/nano-crystalline shell pairing has a photoluminescence quantum yield (PLQY) of greater than approximately 60%. In another, or same, such embodiment, the nano-crystalline core/nano-crystalline shell pairing provides a Type I hetero-structure. One or more embodiments described herein are directed to hetero-structure systems having distinct group I-III-VI material cores. In an exemplary embodiment, a sphere or rod-shaped core/shell quantum dot is fabricated to have a sharp compositional interface between the core and shell or a graded/alloyed interface between core and shell.

Figure 6:
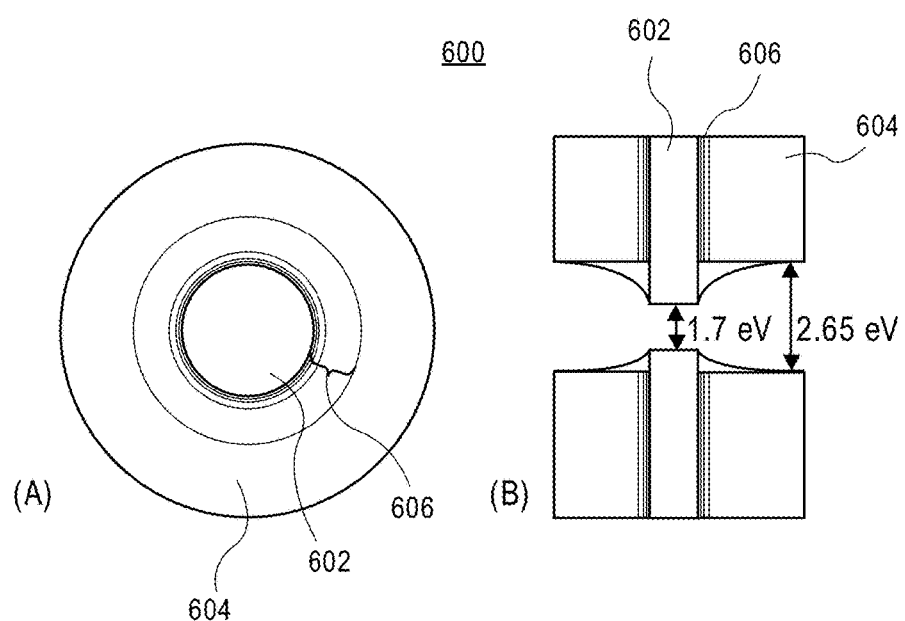
FIG. 6 illustrates a nano-particle in accordance with an embodiment of the invention.

FIG. 6 illustrates an axial cross-sectional view (A) of a spherical nano-particle 600, in accordance with an embodiment of the present invention. Referring to FIG. 6, an alloy region 606 is included between the core 602 and shell 604 of 600. As shown in part (B) of FIG. 6, in one embodiment, the nano-particle 600 demonstrates type I hetero-structure behavior, with excitons preferentially recombining in the core 602 of the nano-crystal 600 due to the smaller, nested bandgap of the seed. Optionally, additional layers of material may be added, including additional epitaxial layers or amorphous inorganic and organic layers. Other suitable embodiments are described below.

In an embodiment, systems described herein include a nano-crystalline core emitter having a direct, bulk band gap approximately in the range of 1-2.5 eV. Exemplary cores include a group I-III-VI semiconductor material based on silver gallium sulfide having a stoichiometry of approximately AgGaS2. In one such embodiment, the nano-crystalline core has a peak emission approximately in the range of 475-575 nanometers.

In one or more embodiments, the nano-crystalline core and nano-crystalline shell pairings described herein have a lattice mismatch of equal to or less than approximately 10%. In some embodiments, less than approximately 6% mismatch is preferable, but up to approximately 10% can be workable. In particular embodiments, the mismatch is less than approximately 4% mismatch, as seen in successful Cd-based systems.

One or more embodiments described herein is directed to a hetero-structure core/shell pairing that is cadmium-free. For example, with reference to the above described nano-crystalline core and nano-crystalline shell pairings, in an embodiment, the first (core) material is a group I-III-VI semiconductor material. In one such embodiment, the second (shell) semiconductor material is a second group I-III-VI material. For example, a suitable I-III-VI/I-III-VI core/shell pairing can include, but is not limited to, copper indium sulfide (CIS)/silver gallium sulfide (AgGaS2), copper indium selenide (CISe)/AgGaS2, copper gallium selenide (CuGaSe2)/copper gallium sulfide (CuGaS2), or CuGaSe2/AgGaS2. In another such embodiment, the second (shell) semiconductor material is a group II-VI material. For example, a suitable I-III-VI/II-VI core/shell pairing can include, but is not limited to, copper indium sulfide (CIS)/zinc selenide (ZnSe), CIS/zinc sulfide (ZnS), copper indium selenide (CISe)/ZnSe, CISe/ZnS, copper gallium selenide (CuGaSe2)/ZnSe, CuGaSe2/ZnS, silver gallium sulfide (AgGaS2)/ZnS, AgGaS2/ZnSe, or silver gallium selenide (AgGaSe2)/ZnS, AgGaSe2/ZnSe.

In an embodiment, the semiconductor hetero-structure further includes a nano-crystalline outer shell composed of a third semiconductor material different from the core and shell semiconductor materials. The third semiconductor material at least partially surrounding the nano-crystalline shell and, in one embodiment, the nano-crystalline outer shell completely surrounds the nano-crystalline shell. In a particular embodiment, the second (shell) semiconductor material one such as, but not limited to, zinc selenide (ZnSe), silver gallium sulfide (AgGaS2) or copper gallium sulfide (CuGaS2), and the third (outer shell) semiconductor material is zinc sulfide (ZnS).

While the shape of the core of the quantum dot depicted in FIG. 4 is a that of a rod, it is to be appreciated that the methods described herein are not limited by the shape of the quantum dot and could be applied to coated quantum dots of many different shapes, including but not limited to spheres, rods, tetrapods, teardrops, sheets, etc. It is not limited by the composition of the quantum dot and can be applied to quantum dots made from a single material or multiple materials in either a core/shell/optional shell/optional shell configuration or an alloyed composition. The semiconductor materials may be selected from the Group II-VI compounds, Group III-V compounds, group IV-IV compounds, group I-III-VI compounds, or any alloy thereof. More specifically the semiconductor materials may be chosen from ZnO, ZnS, ZnSe, ZnTe, CdO, CdS, CdSe, CdTe, HgS, HgSe, HgTe, HgO, AlN, ATP, AlAs, AlSb, GaN, GaP, GaAs, GaSb, GaSe, InN, InP, InAs, InSb, TlN, TlP, TlAs, TlSb, PbS, PbSe, PbTe, MgO, MgS, MgSe, alloys thereof, and mixtures thereof.

What is claimed is:

1. A method of fabricating a semiconductor structure, comprising:
    forming a nanocrystalline core from a first semiconductor material;
    forming at least one nanocrystalline shell from a second, different, semiconductor material that at least partially surrounds the nanocrystalline core, wherein the nanocrystalline core and the nanocrystalline shell(s) form a quantum dot;
    forming an insulator layer encapsulating the quantum dot to create a coated quantum dot; and
    forming at least one additional insulator layer on the coated quantum dot.

2. The method of claim 1, further forming additional insulator layers encapsulating the quantum dot such that defects that may exist in each of the insulating layers are interrupted and do not channel continuously through the insulating layers.

3. The method of claim 1, wherein forming the insulator layer encapsulating the quantum dot to create a coated quantum dot comprises forming a first metal oxide layer encapsulating the quantum dot.

4. The method of claim 3, wherein forming the metal oxide layer encapsulating the quantum dot comprises selecting the metal oxide from a group of metal oxides consisting of silica (SiOx), titanium oxide (TiOx), zirconium oxide (ZrOx), alumina (AlOx), magnesium oxide (MgOx) and hafnia (HfOx).

5. The method of claim 2, wherein forming additional insulator layers on the coated quantum dot provides for improved thermal stability, high temperature reliability, and/or high humidity reliability of the coated quantum dot.

6. The method of claim 2, wherein forming the additional insulator layers on the coated quantum dot comprises forming organic layers and/or inorganic layers on the coated quantum dot.

7. The method of claim 6, wherein forming organic layers comprises forming at least one layer of water-absorbing polymer.

8. The method of claim 7, wherein the water-absorbing polymer is selected from a group consisting of: poly(vinyl alcohol) PVA, poly(ethylene oxide) PEO, polyacrylamide, polyacrylate, poly(acrylic acid) and partially neutralised, lightly cross-linked poly(acrylic acid).

9. The method of claim 6, wherein forming inorganic layers comprises forming a layer with a compound or metal selected from a group of compounds and metals consisting of silica (SiOx), titanium oxide (TiOx), zirconium oxide (ZrOx), alumina (AlOx), magnesium oxide (MgOx) and hafnia (HfOx), and $SiN_x$ copper, cobalt, and iron.

10. The method of claim 1, wherein forming the insulator layer encapsulating the quantum dot to create a coated quantum dot comprises forming a first insulator layer encapsulating the quantum dot using a sol-gel process; and
wherein forming the additional insulator layers on the coated quantum dot comprises forming an additional insulating layer encapsulating the quantum dot using a sol-gel process.

11. The method of claim 10, wherein forming a first insulator layer encapsulating the quantum dot using a sol-gel process comprises forming the first insulator layer encapsulating the quantum dot using a reverse micelle sol-gel process; and
wherein forming the additional insulating layer encapsulating the quantum dot using a sol-gel process comprises forming the additional insulating layer encapsulating the quantum dot using one of: reverse micelle sol-gel process, a direct micelle sol-gel process, a Stober sol-gel process, and a sol-gel process that acidifies the encapsulated quantum dot.

12. The method of claim 1, wherein forming the insulator layer encapsulating the quantum dot to create a coated quantum dot comprises forming a first insulator layer encapsulating the quantum dot by:
dispersing the quantum dot in solution;
adding surfactant to the solution;
adding aminosilane to the solution;
adding alcohol to the solution; and
adding ammonium hydroxide and tetraorthosilicate to the solution.

13. The method of claim 1, wherein forming the insulator layer encapsulating the quantum dot to create a coated quantum dot comprises forming a first insulator layer encapsulating the quantum dot by:
mixing non-polar ligands on a surface of the quantum dot with aminosilanes;
adding polyethylenimine dissolved in alcohol to the quantum dot;
dispersing the quantum dot in water or alcohol; and
adding ammonium hydroxide and tetraorthosilicate.

14. The method of claim 1, wherein, after forming the insulator layer encapsulating the quantum dot to create a coated quantum dot, and prior to forming the at least one additional insulator layer on the coated quantum dot, treating the coated quantum dot with a base or an acid.

15. The method of claim 1, wherein, after forming the at least one additional insulator layer on the coated quantum dot, and prior to further forming additional insulator layers encapsulating the quantum dot, treating the coated quantum dot with a base or an acid.

16. The method of claim 1, wherein forming the insulator layer encapsulating the quantum dot to create a coated quantum dot, or forming the at least one additional insulator layer on the coated quantum dot during the silica coating process, comprises one of: injecting a silica gel forming precursor at least once during the formation, injecting the silica gel forming precursor a plurality of times during the formation, and injecting the silica gel forming precursor using a syringe pump at desired rate.

17. The method of claim 1, further comprising ligand-functionalizing an outer surface of the insulator layer with a ligand selected from a group consisting of organic compounds, and inorganic compounds, with ligand-functionality for bonding to the outer surface by chemical or non-chemical interactions selected from a group consisting of: covalent, ionic, H-bonding, and Van der Waals forces.

18. The method of claim 1, further comprising ligand-functionalizing an outer surface of the insulator layer with a ligand selected from a group consisting of: methoxy and ethoxy silanes (MeO)3SiAllyl, (MeO)3SiVinyl, (MeO)2SiMeVinyl, (EtO)3SiVinyl, EtOSi(Vinyl)3, mono-methoxy silanes, chloro-silanes, and 1,2-bis-(triethoxysilyl)ethane.

19. A semiconductor structure, comprising:
a nanocrystalline core comprising a first semiconductor material;
at least one nanocrystalline shell comprising a second, different, semiconductor material that at least partially surrounds the nanocrystalline core, wherein the nanocrystalline core and the nanocrystalline shell(s) form a quantum dot;
an insulator layer encapsulating the quantum dot to create a coated quantum dot; and
at least one additional insulator layer encapsulating the coated quantum dot.

20. The apparatus of claim 19, further comprising additional insulator layers encapsulating the quantum dot such that defects that may exist in each of the insulating layers are interrupted and do not channel continuously through the insulating layers.

21. The apparatus of claim 19, wherein the insulator layer encapsulating the quantum dot to create a coated quantum dot comprises a first metal oxide layer encapsulating the quantum dot.

22. The apparatus of claim 21, wherein the metal oxide layer encapsulating the quantum dot is selected from a group of metal oxides consisting of silica (SiOx), titanium oxide (TiOx), zirconium oxide (ZrOx), alumina (AlOx), magnesium oxide (MgOx) and hafnia (HfOx).

23. The apparatus of claim 20, wherein the additional insulator layers on the coated quantum dot provide for improved thermal stability, high temperature reliability, and/or high humidity reliability of the coated quantum dot.

24. The apparatus of claim 20, wherein the additional insulator layers on the coated quantum dot comprise organic layers and/or inorganic layers on the coated quantum dot.

25. The apparatus of claim 24, wherein the organic layers comprise at least one layer of water-absorbing polymer.

26. The apparatus of claim 25, wherein the water-absorbing polymer is selected from a group consisting of: poly (vinyl alcohol) PVA, poly(ethylene oxide) PEO, polyacrylamide, polyacrylate, poly(acrylic acid) and partially neutralised, lightly cross-linked poly(acrylic acid).

27. The apparatus of claim 24, wherein the inorganic layers comprise a layer with a compound or metal selected from a group of compounds and metals consisting of silica (SiOx), titanium oxide (TiOx), zirconium oxide (ZrOx), alumina (AlOx), magnesium oxide (MgOx) and hafnia (HfOx), and $SiN_x$, copper, cobalt, and iron.

28. A lighting apparatus, comprising:
a light emitting diode; and
a plurality of quantum dots, each quantum dot comprising:
a nanocrystalline core comprising a first semiconductor material;
at least one nanocrystalline shell comprising a second, different, semiconductor material that at least partially surrounds the nanocrystalline core, wherein the nanocrystalline core and the nanocrystalline shell(s) form a quantum dot;
an insulator layer encapsulating the quantum dot to create a coated quantum dot; and at least one additional insulator layer encapsulating the coated quantum dot.

* * * * *